United States Patent
Saitou

(10) Patent No.: US 11,335,542 B2
(45) Date of Patent: May 17, 2022

(54) PLASMA PROCESSING APPARATUS

(71) Applicant: Tokyo Electron Limited, Tokyo (JP)

(72) Inventor: Tetsuya Saitou, Nirasaki (JP)

(73) Assignee: TOKYO ELECRON LIMITED, Tokyo (JP)

( * ) Notice: Subject to any disclaimer, the term of this patent is extended or adjusted under 35 U.S.C. 154(b) by 98 days.

(21) Appl. No.: 16/918,728

(22) Filed: Jul. 1, 2020

(65) Prior Publication Data

US 2021/0013004 A1 Jan. 14, 2021

(30) Foreign Application Priority Data

Jul. 8, 2019 (JP) .............................. JP2019-126710

(51) Int. Cl.
*H01J 37/32* (2006.01)
*H05H 1/46* (2006.01)

(52) U.S. Cl.
CPC .... *H01J 37/3244* (2013.01); *H01J 37/32834* (2013.01); *H05H 1/46* (2013.01); *H01J 2237/334* (2013.01)

(58) Field of Classification Search
None
See application file for complete search history.

(56) References Cited

U.S. PATENT DOCUMENTS

| | | | | |
|---|---|---|---|---|
| 5,900,103 A * | 5/1999 | Tomoyasu | .......... | C23C 16/4483 156/345.44 |
| 6,077,357 A * | 6/2000 | Rossman | ............ | C23C 16/4585 118/723 R |
| 6,178,918 B1 * | 1/2001 | van Os | .................. | C23C 16/455 118/723 R |
| 6,189,483 B1 * | 2/2001 | Ishikawa | ............. | C23C 16/4405 118/723 E |
| 6,286,451 B1 * | 9/2001 | Ishikawa | ............. | C23C 16/4405 118/723 I |

(Continued)

FOREIGN PATENT DOCUMENTS

JP 2006-225705 A 8/2006
JP 2014-7087 A 1/2014

(Continued)

*Primary Examiner* — Srinivas Sathiraju
(74) *Attorney, Agent, or Firm* — Nath, Goldberg & Meyer; Jerald L. Meyer; Tanya E. Harkins

(57) ABSTRACT

A plasma processing apparatus includes: a processing container; a stage provided in the processing container and configured to place a substrate on the stage; a gas introduction part provided in an upper portion of the processing container to face the stage and configured to introduce a processing gas into the processing container; and an annular exhaust path which is provided in an upper portion of a side wall of the processing container, and in which an opening toward a center of the processing container is formed at an inner circumferential side of the exhaust path, wherein the stage and the gas introduction part are respectively connected to high-frequency power supplies for generating plasma of the processing gas, wherein the exhaust path is grounded, wherein the plasma processing apparatus further comprises a grounded plasma distribution adjuster covering the opening, and wherein through-holes are formed in the plasma distribution adjuster.

17 Claims, 6 Drawing Sheets

(56) References Cited

U.S. PATENT DOCUMENTS

| | | | | |
|---|---|---|---|---|
| 6,486,081 | B1* | 11/2002 | Ishikawa | C23C 16/507 438/788 |
| 6,527,865 | B1* | 3/2003 | Sajoto | C23C 16/4401 118/715 |
| 6,632,322 | B1* | 10/2003 | Gottscho | H01J 37/3244 156/345.33 |
| 9,476,120 | B2* | 10/2016 | Meinhold | H01J 37/32724 |
| 10,131,994 | B2* | 11/2018 | Nguyen | H01J 37/32834 |
| 2003/0172872 | A1* | 9/2003 | Thakur | C23C 16/45536 118/715 |
| 2004/0149394 | A1* | 8/2004 | Doan | H01J 37/32009 216/67 |
| 2004/0219789 | A1* | 11/2004 | Wood | H01L 21/67028 438/690 |
| 2006/0060138 | A1* | 3/2006 | Keller | H01J 37/3244 118/715 |
| 2007/0068625 | A1* | 3/2007 | Funk | C23C 16/45565 156/345.29 |
| 2008/0110567 | A1* | 5/2008 | Miller | H01J 37/32449 156/345.26 |
| 2014/0073146 | A1* | 3/2014 | Okada | C23C 16/402 438/798 |
| 2014/0123895 | A1* | 5/2014 | Kato | H01J 37/32651 118/697 |
| 2014/0373783 | A1* | 12/2014 | Sawada | C23C 16/50 118/723 R |
| 2015/0136734 | A1* | 5/2015 | Chae | H01J 37/32357 216/67 |
| 2015/0140786 | A1* | 5/2015 | Kwak | H01L 31/18 438/478 |
| 2015/0228459 | A1* | 8/2015 | Matsumoto | H01J 37/32449 438/714 |
| 2015/0337441 | A1* | 11/2015 | Kwak | H01J 37/32733 216/37 |
| 2015/0357181 | A1* | 12/2015 | Yamamoto | C23C 16/30 438/778 |
| 2015/0380218 | A1* | 12/2015 | Tan | H01J 37/32568 156/345.33 |
| 2016/0284542 | A1* | 9/2016 | Noda | H01J 37/32091 |
| 2017/0104426 | A1* | 4/2017 | Mills | H02S 40/22 |
| 2017/0133202 | A1* | 5/2017 | Berry, III | C23C 16/511 |
| 2017/0309500 | A1* | 10/2017 | Meng | H01L 22/12 |
| 2017/0342561 | A1* | 11/2017 | Lin | C23C 16/509 |
| 2018/0211822 | A1* | 7/2018 | Gohira | H01L 21/67069 |
| 2019/0382897 | A1* | 12/2019 | Tabata | H01J 37/32082 |
| 2020/0002828 | A1* | 1/2020 | Mills | H05H 1/24 |
| 2021/0013004 | A1* | 1/2021 | Saitou | H01J 37/32834 |
| 2021/0032753 | A1* | 2/2021 | Ravi | C23C 16/509 |
| 2021/0088367 | A1* | 3/2021 | Kutney | H01J 37/32449 |

FOREIGN PATENT DOCUMENTS

| | | |
|---|---|---|
| JP | 2016115848 A | 6/2016 |
| KR | 10-2017-0012084 A | 2/2017 |

* cited by examiner

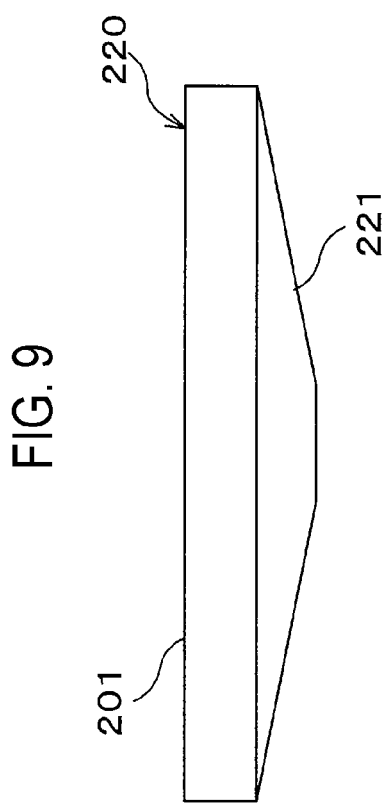

PLASMA PROCESSING APPARATUS

CROSS-REFERENCE TO RELATED APPLICATION(S)

This application is based upon and claims the benefit of priority from Japanese Patent Application No. 2019-126710, filed on Jul. 8, 2019, the entire contents of which are incorporated herein by reference.

TECHNICAL FIELD

The present disclosure relates to a plasma processing apparatus.

BACKGROUND

Patent Document 1 discloses a plasma processing apparatus that performs a plasma process of depositing a thin film, etching, or the like. This plasma processing apparatus includes a processing container, a gas supplier for supplying a processing gas into the processing container, a stage provided in the processing container and configured to place a wafer thereon, an upper electrode provided above the stage, and a plasma generator for generating plasma of the processing gas in the processing container by supplying a high-frequency power to at least one of the upper electrode and the stage. In the plasma processing apparatus, an exhaust flow path is formed by the side wall of the processing container and the side surface of the stage, an exhaust pipe forming an exhaust port is disposed in a bottom portion of the exhaust flow path, and an exhaust device is connected to the exhaust pipe.

PRIOR ART DOCUMENT

[Patent Document]
Patent Document 1: Japanese laid-open publication No. 2016-115848

SUMMARY

An aspect of the present disclosure provides a plasma processing apparatus for processing a substrate using plasma, the apparatus including: a processing container configured to be depressurizable and to accommodate the substrate in the processing container; a stage provided in the processing container and configured to place the substrate on the stage; a gas introduction part provided in an upper portion of the processing container to face the stage and configured to introduce a processing gas into the processing container; and an exhaust path which is provided in an annular shape in an upper portion of a side wall of the processing container, and in which an opening toward a center of the processing container is formed at an inner circumferential side of the exhaust path, wherein the stage and the gas introduction part are respectively connected to high-frequency power supplies for generating plasma of the processing gas in the processing container, wherein the exhaust path is grounded, wherein the plasma processing apparatus further comprises a plasma distribution adjuster, which is provided so as to cover the opening in the exhaust path and is grounded, and wherein a plurality of through-holes is formed in the plasma distribution adjuster.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 9 is a side view illustrating another example of the shower plate.

DETAILED DESCRIPTION

Figure 1:
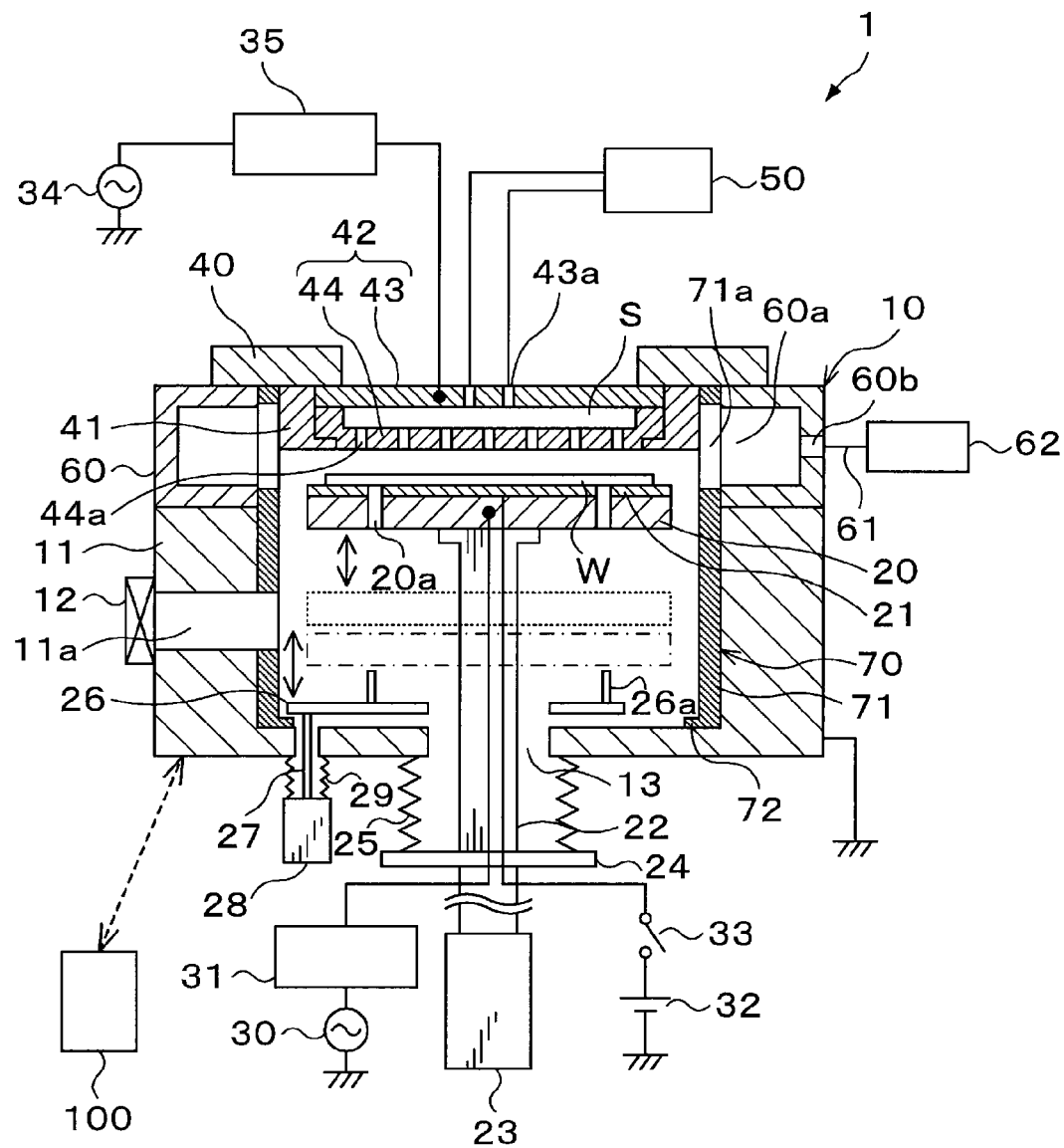
FIG. 1 is an explanatory view schematically illustrating outline of a configuration of an etching apparatus as a plasma processing apparatus according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In a process of manufacturing a semiconductor device, various kinds of plasma processes, such as an etching process and a film formation process, are performed on a semiconductor wafer (hereinafter, referred to as a "wafer").

A plasma processing apparatus that performs the plasma processes includes, for example, a processing container, a gas supplier configured to supply a processing gas into the processing container, a stage provided in the processing container and configured to place a wafer thereon, and an upper electrode provided above the stage. Then, by supplying high-frequency powers to the upper electrode and the stage, the processing gas is converted into plasma in the processing container.

In addition, in a conventional plasma processing apparatus, the interior of a processing container is evacuated from a bottom wall side of the processing container. For example, in Patent Document 1, an exhaust flow path is formed by the side wall of the processing container and the side surface of the stage, and an exhaust pipe that forms an exhaust port is disposed in the bottom portion of the exhaust flow path.

In recent years, plasma processing apparatuses having a processing container of a small capacity, such as a plasma processing apparatus for atomic layer etching (ALE), have been developed. In such a plasma processing apparatus, an exhaust path different from that of Patent Document 1 is used. Specifically, an exhaust path which is provided in an annular shape in an upper portion of a side wall of the processing container, and in which an opening toward the center of the processing container is formed at the inner peripheral side of the exhaust path, may be used. However, according to the results of intensive investigation performed by the present inventor, in a case where the above-described exhaust path is used, when a high-frequency power of 60 MHz or the like is supplied to an upper electrode, a plasma processing amount such as an etching amount becomes smaller in an outer peripheral portion of a wafer than in the center of the wafer, and thus a plasma process may be performed non-uniformly in a surface of the wafer.

Therefore, in the case of using an exhaust path which is provided in the annular shape at the upper portion of the side wall of the processing container and, in which the opening toward the center of the processing container is formed at the inner peripheral side of the exhaust path, a technique according to the present disclosure suppresses reduction of a plasma processing amount in an outer peripheral portion of a wafer compared to in the center of the wafer.

Hereinafter, a plasma processing apparatus according to the present embodiment will be described with reference to the drawings. In the specification and drawings, elements having substantially the same functional configurations will be denoted by the same reference numerals, and redundant explanations will be omitted.

Figure 2:
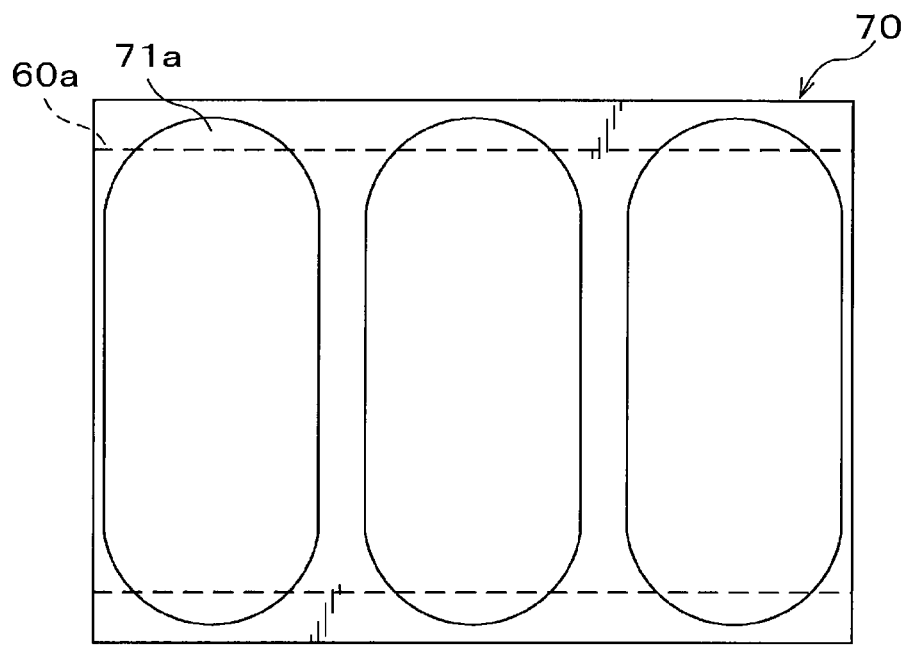
FIG. 2 is an enlarged side view of a portion, in which through-holes are formed, in a plasma distribution adjuster.

FIG. 1 is an explanatory view schematically illustrating outline of a configuration of a plasma processing apparatus according to an embodiment. FIG. 2 is an enlarged side view of a portion, in which through-holes are formed, in a plasma distribution adjuster to be described later.

A plasma processing apparatus 1 in the example of FIG. 1 is configured as an etching apparatus that performs an etching process for removing, for example, a natural oxide film. Specifically, the plasma processing apparatus 1 is configured as an etching apparatus that etches the natural oxide film through a sputter etching process or an ALE process.

The plasma processing apparatus 1 (hereinafter, referred to as "etching apparatus 1") has a processing container 10 that is configured to be depressurizable and to accommodate therein a wafer W as a substrate. A diameter of the wafer W is, for example, 300 mm.

The processing container 10 includes a container body 11 formed in a cylindrical shape and having a bottom. The container body 11 is formed of a conductive metal such as A5052, which is an aluminum-containing metal. In addition, the container body 11 is grounded.

A loading and unloading port 11a for the wafer W is provided in the side wall of the container body 11, and a gate valve 12 configured to open and close the loading and unloading port 11a is provided at the loading and unloading port 11a. In addition, an exhaust duct 60, which will be described later, is provided on the container body 11, and forms a portion of the side wall of the processing container 10.

A stage 20, on which the wafer W is horizontally placed and which has a circular shape in a plan view, is provided in the processing container 10. The stage 20 constitutes a lower electrode. An electrostatic chuck 21 is provided on the stage 20. A heater (not illustrated) for heating the wafer W is provided inside the stage 20.

A high-frequency power for bias, for example, a high-frequency power of 13.56 MHz, is supplied to the stage 20 from a high-frequency power supply 30 provided outside the processing container 10 via a matcher 31. A DC voltage is applied to the electrostatic chuck 21 from a DC power supply 32 provided outside the processing container 10. The DC voltage is switched ON and OFF by a switch 33.

An upper end portion of a support 22, which penetrates a bottom wall of the processing container 10 through an opening 13 formed in the bottom wall of the processing container 10 and extends in a vertical direction, is connected to a central portion of a bottom surface of the stage 20. A lower end portion of the support 22 is connected to a lifting mechanism 23. By driving the lifting mechanism 23, the stage 20 can move up and down among a transfer position indicated by a one-dot chain line, a first processing position above the transfer position, and a second processing position above the first processing position. The transfer position is a position at which the stage 20 stands by when the wafer W is delivered between a transfer mechanism (not illustrated) of the wafer W entering the processing container 10 through the loading and unloading port 11a of the processing container 10 and support pins 26a to be described later. The first processing position is a position at which a sputter etching process is performed on the wafer W, and the second processing position is a position at which an ALE process is performed on the wafer W.

A flange 24 is provided on the support 22 outside the processing container 10. A bellows 25 is provided between the flange 24 and a portion in the bottom wall of the processing container 10 where the support 22 penetrates, so as to surround an outer peripheral portion of the support 22. Thus, airtightness of the processing container 10 is maintained.

A wafer lifter 26 having a plurality of, for example, three, support pins 26a (only two support pins 26a are illustrated) are disposed below the stage 20 in the processing container 10. A support column 27 is provided at a lower surface side of the wafer lifter 26. The support column 27 penetrates the bottom wall of the processing container 10 and is connected to a lifting mechanism 28 provided outside the processing container 10. Therefore, the wafer lifter 26 can move up and down by driving the lifting mechanism 28, and by the vertical movement of the wafer lifter 26, the support pins 26a protrude or retreat from the top surface of the stage 20 through through-holes 20a formed in the stage 20.

A bellows 29 is provided between the lifting mechanism 28 and a portion in the bottom wall of the processing container 10 where the support column 27 penetrates, so as to surround an outer periphery of the support column 27. Thus, airtightness of the processing container 10 is maintained.

An annular insulating support 40 is provided above the exhaust duct 60 in the processing container 10. A shower head support 41 formed of quartz and serving as an insulating member is provided on the bottom surface side of the insulating support 40. A shower head 42, which is a gas introduction part for introducing a processing gas into the processing container 10 and constitutes an upper electrode, is supported by the shower head support 41. Specifically, the shower head 42 is supported by the shower head support 41 such that the shower head 42 is located on the upper side of the processing container 10 and faces the stage 20.

The shower head 42 has a disk-shaped head body 43 and a shower plate 44 connected to the head body 43, and a gas diffusion space S is formed between the head body 43 and the shower plate 44. The head body 43 and the shower plate 44 are formed of metal. A diameter of the shower plate 44 is substantially the same as that of the wafer W. Two gas introduction holes 43a in communication with the gas diffusion space S are formed in the head body 43, and a large number of gas ejection holes 44a in communication with the gas diffusion space S are formed in the shower plate 44.

A gas supply mechanism 50 configured to supply the processing gas to the processing container 10 is connected to the gas introduction hole 43a. Although not illustrated, the gas supply mechanism 50 includes a source of each processing gas, a storage tank for temporarily storing the processing gas supplied from the source, and a flow rate control valve.

A high-frequency power for plasma generation, for example, a high-frequency power of 60 MHz or 13.56 MHz, is supplied to the shower head 42 from a high-frequency power supply 34 provided outside the processing container 10 via a matcher 35.

In addition, the exhaust duct 60, which is formed in an annular shape and serves as an exhaust path, is provided in an upper portion of the side wall of the processing container 10 so as to be concentric with the stage 20. The exhaust duct 60 is formed by, for example, bending a member having a U shape in a cross-sectional view into an annular shape such that an opening 60a toward the center of the processing container 10 is formed over the entire inner circumference of the exhaust duct 60. A depth of a groove in the exhaust duct 60, which forms the U shape of the exhaust duce 60, is, for example, about 45 mm, and the shortest distance from the opening 60a to the shower head 42 is, for example, about 50 mm.

An exhaust port 60b is formed in a portion of the outer peripheral wall of the exhaust duct 60. One end portion of an exhaust pipe 61 is connected to the exhaust port 60b. The other end of the exhaust pipe 61 is connected to an exhaust device 62 configured by, for example, a vacuum pump, an opening and closing valve, and the like. In addition, the exhaust duct 60 is formed of a conductive metal such as A5052, which is an aluminum-containing metal, and has the same potential as the container body 11. That is to say, the exhaust duct 60 is also grounded.

In addition, a plasma distribution adjuster (hereinafter, referred to as "plasma adjuster") 70 is provided in the processing container 10 along the side wall of the processing container 10 so as to cover the opening 60a in the exhaust duct 60. The plasma adjuster 70 is formed of a conductive metal such as A5052, which is an aluminum-containing metal. In addition, the plasma adjuster 70 is grounded. In addition, the surface of the plasma adjuster 70 has a plasma-resistant coating formed by a ceramic spraying process or an anodizing process. For example, yttria is used as a material for the ceramic spraying process.

The plasma adjuster 70 has a cylindrical body portion 71, and is provided so as to be concentric with the stage 20. The body portion 71 is formed so as to cover the entire inner peripheral surface of the side wall of the processing container 10, and a plurality of through-holes 71a are formed in at least a portion of the body portion 71 facing the exhaust duct 60. A thickness of the body portion 71 is, for example, 7 mm.

When viewed in penetration directions of the through-holes 71a, each of the through-holes 71a has, for example, an elliptical shape (specifically, a rounded rectangular shape), which has a vertical length longer than the opening 60a in the exhaust duct 60, as illustrated in FIG. 2.

All of the through-holes 71a have the same shape, and are formed so as to be uniformly distributed.

In addition, the through-holes 71a are formed such that an opening ratio of a portion of the body portion 71 covering the opening 60a in the exhaust duct 60 is 50% or more and 80% or less. Hereinafter, the "opening ratio of the plasma adjuster 70" means this opening ratio. For example, when a diameter of the body portion 71 of the plasma adjuster 70 for the wafer W having the diameter of 300 mm is 460 mm, by providing sixty elongated through-holes 71a each having an area of 872 mm² and by setting a vertical length of an effective region of the plasma adjuster 70 to be 50 mm, the opening ratio of 73% can be obtained.

A lower end portion of the plasma adjuster 70 is formed to extend toward the center of the processing container 10 and is bonded to the bottom wall of the processing container 10. Specifically, the plasma adjuster 70 has a fixing portion 72, which is formed to extend from a lower end of the body portion 71 toward the center of the processing container 10. The fixing portion 72 and the bottom wall of the processing container 10 are bonded by screwing or the like. Thus, the plasma adjuster 70 is fixed in the processing container 10.

The etching apparatus 1 configured as described above is provided with a controller 100. The controller 100 is configured with, for example, a computer including a CPU, a memory, and the like, and includes a program storage (not illustrated). In the program storage, a program for implementing a wafer processing to be described later in the etching apparatus 1 is stored. The program may be recorded in a non-transitory computer-readable storage medium, and may be installed in the controller 100 from the storage medium. In addition, a part or all of the program may be implemented by dedicated hardware (a circuit board).

Next, a wafer processing performed using the etching apparatus 1 will be described.

In the wafer processing, first, a natural oxide film is anisotropically etched through a sputter etching process, and then the natural oxide film is isotropically etched through an ALE process.

In the sputter etching process, first, the gate valve 12 is opened, and a transfer mechanism (not illustrated) holding a wafer W is introduced into the processing container 10 from a transfer chamber (not illustrated), which is in a vacuum atmosphere and adjacent to the processing container 10, through the loading and unloading port 11a. Then, the wafer W is transferred to a location above the stage 20, which is located at the transfer position described above. At this time, the interior of the processing container 10 is evacuated through the exhaust duct 60 so as to be adjusted to a desired pressure. Subsequently, the wafer W is delivered onto the raised support pins 26a. Then, the transfer mechanism is retracted from the processing container 10, and the gate valve 12 is closed. In addition, the support pins 26a are lowered and the stage 20 is raised, whereby the wafer W is placed on the stage 20. Subsequently, the stage 20 is moved to the first processing position described above. The first processing position is, for example, a position where a distance from the top surface of the stage 20 to the bottom surface of the shower plate 44 is 40 mm.

Subsequently, Ar gas is supplied as a processing gas to the processing container 10 from the gas supply mechanism 50. In addition, a high-frequency power of 60 MHz is supplied from the high-frequency power supply 34 to the shower head 42, and a high-frequency power of 13.56 MHz is supplied from the high-frequency power supply 30 to the stage 20.

Thus, plasma of Ar gas is generated in the processing container 10, and Ar ions in the plasma collide with the surface of the wafer W to anisotropically etch the natural oxide film formed on the surface of the wafer W.

In the etching apparatus 1 that also performs the ALE process, during the sputter etching process using the plasma of Ar gas, a distance from the shower head 42 to the grounded exhaust duct 60 is relatively closer than the distance from the shower head 42 to the stage 20. Therefore, unlike the present embodiment, when the plasma adjuster 70 covering the opening 60a in the exhaust duct 60 is not provided, the plasma of Ar gas spreads through the opening 60a into the exhaust duct 60. As a result, since a plasma density above the outer peripheral portion of the wafer W becomes low, an etching amount at the outer peripheral portion of the wafer W decreases compared with the central portion of the wafer W. In contrast, by providing the grounded plasma adjuster 70 as in the present embodiment, an amount of the plasma of Ar gas which spreads into the exhaust duct 60 can be reduced. Thus, it is possible to prevent the plasma density above the outer peripheral portion of the wafer W from decreasing. Accordingly, it is possible to suppress the reduction of the etching amount in the outer peripheral portion of the wafer W compared with that in the central portion of the wafer W. In addition, since the plasma adjuster 70 has the through-holes 71a formed therein, even when the plasma adjuster 70 is provided so as to close the opening 60a in the exhaust duct 60, exhaust characteristics do not deteriorate.

After etching the natural oxide film, the supply of the high-frequency power to the shower head 42 and the supply of the high-frequency power to the stage 20 are stopped. However, the supply of Ar gas is continued and the interior of the processing container 10 is purged with Ar gas. When the purge step is completed, the sputter etching process is terminated.

The ALE process is performed, for example, by alternately repeating a plasma processing step using $Cl_2$ gas and a plasma processing step using Ar gas, with a purge step interposed therebetween. During the ALE process, the stage 20 is moved to the second processing position described above. The second processing position is, for example, a position where the distance from the top surface of the stage 20 to the bottom surface of the shower plate 44 is 10 mm to 40 mm.

In the plasma processing step using $Cl_2$ gas in the ALE process, $Cl_2$ gas is supplied from the gas supply mechanism 50 to the processing container 10.

In this step, $Cl_2$ is adsorbed to the natural oxide film formed on the surface of the wafer W within the processing container 10.

After this step, the interior of the processing container 10 is purged with Ar gas.

In the subsequent plasma processing step using Ar gas, Ar gas is supplied to the processing container 10. In addition, a high-frequency power of 60 MHz is supplied from the high-frequency power supply 34 to the shower head 42, and a high-frequency power for bias (a high-frequency power of 13.56 MHz) is supplied from the high-frequency power supply 30, which is provided outside the processing container 10, to the stage 20 via the matcher 31.

Thus, plasma of Ar gas is generated in the processing container 10, and a portion of the natural oxide film formed on the surface of the wafer W, to which Cl ions are adsorbed, is removed by Ar ions in the plasma.

After this step, the interior of the processing container 10 is purged with Ar gas.

In the ALE process, by repeating the above-described steps, it is possible to efficiently supply an etching gas to a bottom portion having a high aspect ratio on the wafer W, and thus it is possible to etch a natural oxide film.

After the ALE process, the wafer W is unloaded from the processing container 10 in the reverse order of loading the wafer W in the sputter etching process.

As described above, in the present embodiment, the etching apparatus 1 includes: the processing container 10 configured to be depressurizable and to accommodate therein the wafer W; the stage 20 provided in the processing container 10 and configured to place the wafer W thereon; the shower head 42 provided at the upper portion of the processing container 10 so as to face the stage 20; and the exhaust duct 60 which is provided in an annular shape in the upper portion of the side wall of the processing container 10 and in which the opening toward the center of the processing container 10 is formed. In addition, the stage 20 and the shower head 42 are connected to the high-frequency power supplies 30 and 34 for generating plasma of the processing gas in the processing container 10, respectively, and the exhaust duct 60 is grounded. The etching apparatus 1 further includes the grounded plasma adjuster 70 covering the opening 60a in the exhaust duct 60. Accordingly, since the amount of plasma spreading into the exhaust duct 60 can be reduced, the amount of sputter etching on the outer peripheral portion of the wafer W can be suppressed from being reduced compared with the central portion of the wafer W. In addition, since the plasma adjuster 70 has the plurality of through-holes 71a formed therein, exhaust characteristics do not deteriorate by the plasma adjuster 70.

Figure 3:
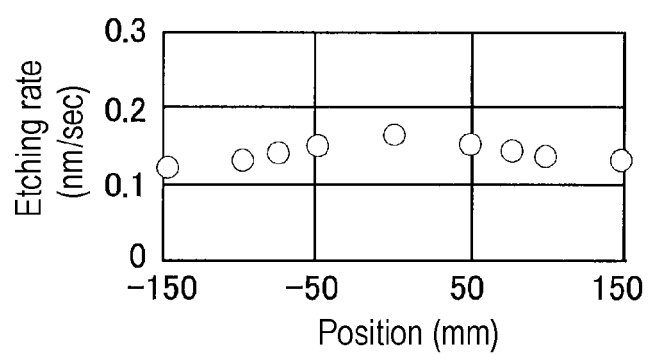
FIG. 3 is a diagram specifically illustrating an effect obtained by providing the plasma distribution adjuster.
Figure 4:
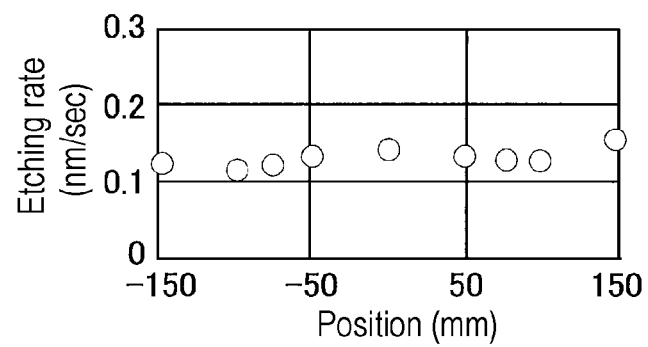
FIG. 4 is a diagram specifically illustrating an effect obtained by providing the plasma distribution adjuster.

FIGS. 3 and 4 are diagrams specifically illustrating the effects of providing the plasma adjuster 70. FIG. 3 is a diagram showing a distribution of etching amounts when the sputter etching process described above was performed using an etching apparatus without the plasma adjuster 70. The etching apparatus used here is different from the above-described etching apparatus 1 only in that the plasma adjuster 70 is not provided. FIG. 4 is a diagram showing a distribution of etching amounts when the sputter etching process described above was performed using the etching apparatus 1 provided with the plasma adjuster 70. The plasma adjuster 70 used here had the through-holes 71a having the shape illustrated in FIG. 2, and the opening ratio was 77%. In each of FIGS. 3 and 4, the horizontal axis represents a position from the center of the wafer W, and the vertical axis represents an etching rate of Ar gas (=an etching amount/processing time). The sputter etching condition when the results shown in FIGS. 3 and 4 were obtained was as follows.

Pressure in the processing container 10: 5 mTorr
Power supplied to the shower head 42: 50 W
Power supplied to the stage 20: 900 W
Distance from the bottom surface of the shower plate 44 to the top surface of the stage 20: 40 mm
Flow rate of Ar gas: 30 sccm
Temperature of the stage: 30 degrees C.
Processing time: 20 seconds As shown in FIG. 3, when the plasma adjuster 70 was not provided, the etching amount was smaller in the outer peripheral portion of the wafer W than in the central portion of the wafer W. In the case where the plasma adjuster 70 was not provided, the in-plane non-uniformity NU of etching amount of the wafer was 8.8%. An in-plane non-uniformity NU of the etching amount of the wafer is expressed by the following equation.

$$NU = ((\text{standard deviation of etching amount})/(\text{average etching amount})) \times 100$$

On the other hand, as shown in FIG. 4, when the plasma adjuster 70 was provided, the etching amount in the outer peripheral portion of the wafer W was equal to that in the central portion of the wafer W. In addition, when the plasma adjuster 70 of the above-described embodiment was provided, the in-plane non-uniformity NU of etching amount in the wafer was 8.7%, which is improved compared with the case where the plasma adjuster 70 was not provided.

In addition, according to the present embodiment, it is possible to adjust a ratio of ground potential occupying the opening 60a in the exhaust duct 60 by changing an opening ratio of the plasma adjuster 70. Thus, it is possible to control the sputter etching amount on the outer peripheral portion of the wafer W by adjusting the plasma distribution.

In some embodiments, the opening ratio of the plasma adjuster 70 may be set to be 77% or more, that is, a ratio of the opening 60a covered with a member having ground potential may set to be 23% or less. According to the results of intensive investigation performed by the present inventor, this is because, in the case where the opening ratio is less than 77% and the ratio of the opening 60a covered with the member having ground potential exceeds 23%, the etching amount of the outer peripheral portion of the wafer W is increased, and thus in-plane non-uniformity may become worse than in the case where the plasma adjuster 70 is not provided.

In some embodiments, the opening ratio of the plasma adjuster 70 may be set to be 80% or less. This is because, when the opening ratio exceeds 80%, it becomes difficult to machine the plasma adjuster 70, and the strength of the plasma adjuster 70 decreases.

In addition, in the present embodiment, the through-holes 71a formed in the plasma adjuster 70 have the same shape and are uniformly distributed. Accordingly, the distribution of etching amounts of the wafer W in the circumferential direction can be made uniform.

In addition, in the present embodiment, the plasma adjuster 70 has a plasma-resistant coating formed by a ceramic spraying process or an anodizing process. Accordingly, it is possible to prevent the plasma adjuster 70 from being damaged by the plasma during the sputter etching process or the ALE process.

Figure 5:
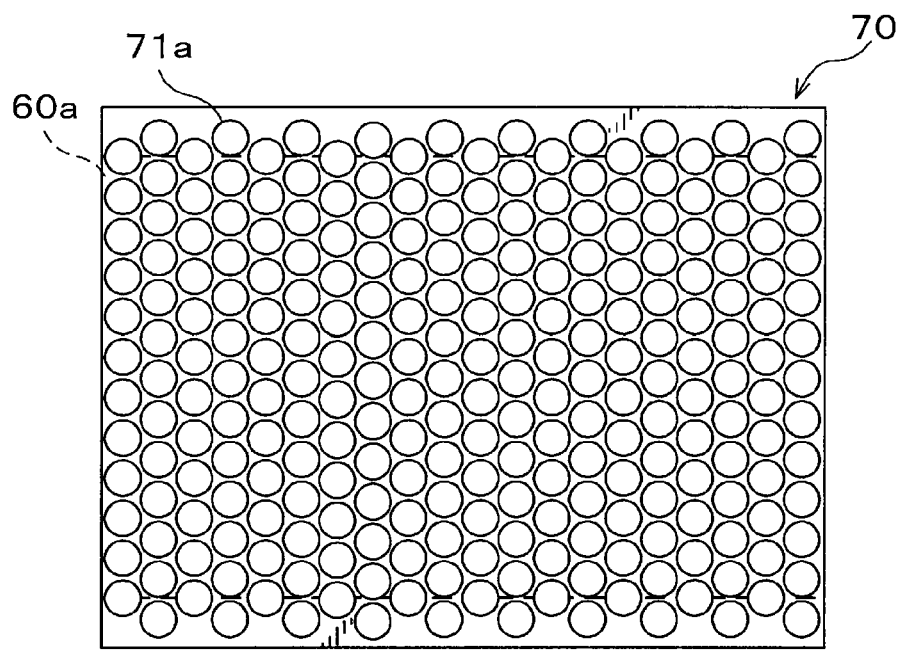
FIG. 5 is a view illustrating another example of a shape of the through-holes in the plasma distribution adjuster.

FIG. 5 is a view illustrating another example of a shape of the through-holes 71a formed in the plasma adjuster 70.

The shape of the through-holes 71a when viewed in the penetration direction is not limited to the elliptical shape illustrated in FIG. 2. For example, the through-holes 71a may have a circular shape having a diameter smaller than the vertical length of the opening 60a in the exhaust duct 60, as illustrated in FIG. 5. Even in this case, the through-holes 71a may be formed such that the opening ratio of the plasma adjuster 70 is 77% or more.

In the foregoing, a portion of the shower plate 44 facing the wafer W placed on the stage 20 is formed flat. However, the shape of the shower plate 44 is not limited thereto.

Figure 6:
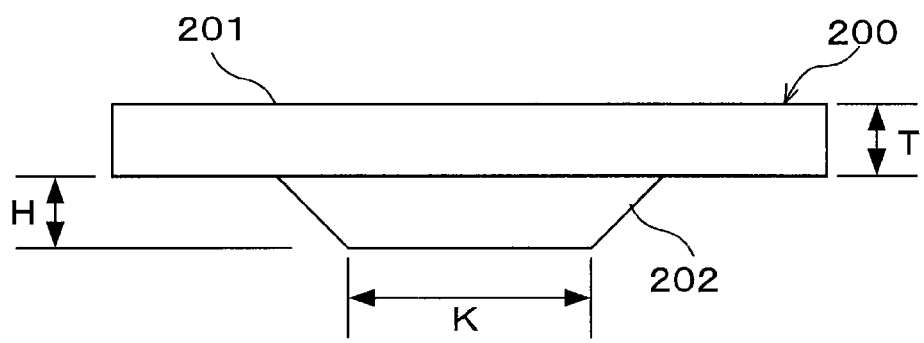
FIG. 6 is a side view illustrating another example of the shower plate.

FIG. 6 is a side view illustrating another example of the shower plate.

A shower plate 200 of FIG. 6 has a disk portion 201 formed in a disk shape, and a convex portion 202 protruding downward from a central portion of the disk portion 201. In addition, the shower plate 200 also has gas ejection holes (not illustrated), like the shower plate 44 of FIG. 1.

By using the shower plate 200, it is possible to change the etching amount by changing the plasma density in the central portion of the wafer W.

Therefore, it is possible to reduce the etching amount in the central portion of the wafer W without changing the etching amount in the outer peripheral portion of the wafer W. Accordingly, when only the plasma adjuster 70 is provided and the etching amount in the central portion of the wafer W is larger than that in other portions, it is possible to suppress the in-plane uniformity NU of the sputter etching amount in the wafer W by additionally using the shower plate 200.

A thickness T of the disk portion 201 is, for example, 9 mm.

In addition, a width K of the convex portion 202 in the radial direction may be, for example, 150 mm or less, which is equal to or less than the radius of the wafer W. This is because making the width K too large results in the same effect as a case where the shower plate 44 is simply made thick.

A height H of the convex portion 202 may be, for example, 3 mm or less. According to the results of intensive investigation performed by the present inventor, this is because the sputter etching amount in an intermediate portion, which is a portion between the central portion and the outer peripheral portion of the wafer W, is reduced by providing the convex portion 202, but when the height H exceeds 3 mm, an amount of reduction becomes larger, which rather impedes suppression of the in-plane non-uniformity NU of the sputter etching amount in the wafer W.

Figure 7:
FIG. 7 is a cross-sectional view illustrating another example of the shower plate.
Figure 8:
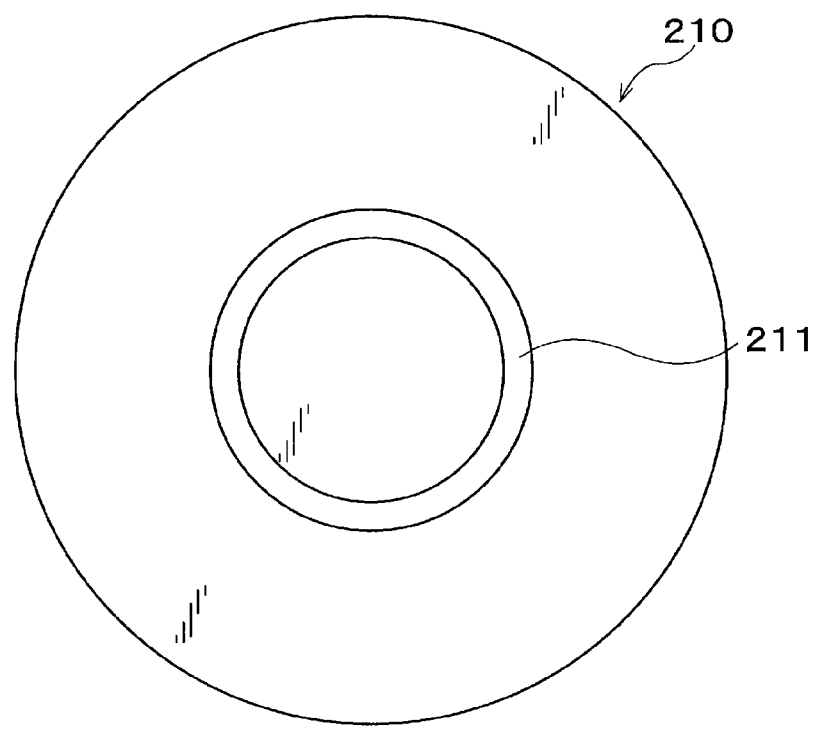
FIG. 8 is a bottom view of the shower plate of FIG. 7.

FIG. 7 is a cross-sectional view illustrating another example of the shower plate, and FIG. 8 is a bottom view of the shower plate of FIG. 7.

A shower plate 210 of FIGS. 7 and 8 has an annular groove 211, which is formed on the bottom surface of the shower plate 210 and is concentric with the shower plate 210. By using the shower plate 210, it is possible to increase the sputter etching amount in the intermediate portion, which is a portion between the central portion and the outer peripheral portion of the wafer W and faces the annular groove 211, compared with the case where the shower plate 44 having a flat bottom surface is used. Accordingly, when only the plasma adjuster 70 is provided and the etching amount in the intermediate portion of the wafer W is smaller than that in other portions, it is possible to suppress the in-plane non-uniformity NU of the sputter etching amount in the wafer W by additionally using the shower plate 210 70.

In addition, the shower plate 210 also has gas ejection holes (not illustrated), like the shower plate 44 of FIG. 1.

FIG. 9 is a side view illustrating still another example of the shower plate.

The convex portion 202 of the shower plate 200 in FIG. 6 has a truncated cone shape formed only on the central portion of the bottom surface of the shower plate 200, but a convex portion 221 of the shower plate 220 in FIG. 9 has a truncated cone shape formed on the entire bottom surface of the shower plate 220.

Even when the shower plate 220 is used together with the plasma adjuster 70, it is possible to suppress the in-plane non-uniformity NU of the sputter etching amount in the wafer W.

In addition, the shower plate 220 also has gas ejection holes (not illustrated), like the shower plate 44 of FIG. 1.

In the foregoing, the etching apparatus has been described as an example, but the plasma processing apparatus according to the present embodiment is applicable to an apparatus that performs other processes using plasma, such as a film-forming process.

It shall be understood that the embodiments disclosed herein are illustrative and are not limiting in all aspects. The above-described embodiments may be omitted, replaced, or modified in various forms without departing from the scope and spirit of the appended claims.

In addition, the following configurations also belong to the technical scope of the present disclosure.

(1) A plasma processing apparatus for processing a substrate using plasma, the apparatus including:

a processing container configured to be depressurizable and to accommodate the substrate in the processing container;

a stage provided in the processing container and configured to place the substrate on the stage;

a gas introduction part provided in an upper portion of the processing container to face the stage and configured to introduce a processing gas into the processing container; and an exhaust path which is provided in an annular shape in an upper portion of a side wall of the processing container, and in which an opening toward a center of the processing container is formed at an inner circumferential side of the exhaust path.

wherein the stage and the gas introduction part are respectively connected to a high-frequency power supplies for generating plasma of the processing gas in the processing container, wherein the exhaust path is grounded, wherein the plasma processing apparatus further includes a plasma distribution adjuster, which is provided so as to cover the opening in the exhaust path and is grounded, and wherein a plurality of through-holes is formed in the plasma distribution adjuster.

According to item (1), it is possible to suppress reduction of the plasma processing amount in the outer peripheral portion of the substrate compared with that in the central portion of the substrate.

(2) The plasma processing apparatus of item (1), wherein an opening ratio of a portion, which covers the opening in the exhaust path, in the plasma distribution adjuster is 50% or more and 80% or less.

According to item (2), it is possible to improve the in-plane uniformity of the plasma processing amount in the substrate.

(3) The plasma processing apparatus of item (1) or (2), wherein the shape of each of the through-holes when viewed in a penetration direction of the through-holes is a circular shape having a diameter that is less than the vertical length of the opening in the exhaust path.

(4) The plasma processing apparatus of item (1) or (2), wherein the shape of each of the through holes when viewed in a penetration direction of the through-holes is an elliptical shape having a vertical length that is longer than that of the opening in the exhaust path.

(5) The plasma processing apparatus of any one of items (1) to (4), wherein all of the through-holes have the same shape, and are formed in the plasma distribution adjustor so as to be uniformly distributed.

According to item (5), it is possible to make the distribution of the plasma processing amounts in the circumferential direction uniform.

(6) The plasma processing apparatus of any one of items (1) to (5), wherein a surface of the plasma distribution adjuster has a plasma-resistant coating formed by a ceramic spraying process or an anodizing process.

According to item (6), it is possible to prevent the plasma distribution adjuster from being damaged during the plasma processing.

(7) The plasma processing apparatus of any one of items (1) to (6), wherein a lower end portion of the plasma distribution adjuster is formed so as to extend toward the center of the processing container, and is bonded to a bottom wall of the processing container.

(8) The plasma processing apparatus of any one of items (1) to (7), wherein the gas introduction part has a convex portion protruding downward form a center portion of a bottom surface of the gas introduction part.

According to item (8), it is possible to further improve the in-plane uniformity of the plasma processing amount in the substrate.

(9) The plasma processing apparatus of item (8), wherein the convex portion of the gas introduction part has a truncated cone shape.

(10) The plasma processing apparatus of any one of items (1) to (9), wherein the gas introduction part has an annular groove, which is formed in a bottom surface of the gas introduction part and is concentric with the gas introduction part.

According to item (10), it is possible to further improve the in-plane uniformity of the plasma processing amount in the substrate.

According to the present disclosure, in the case of using an exhaust path, which is provided in an annular shape in an upper portion of a side wall of a processing container, and in which an opening toward a center of the processing container is formed at an inner peripheral side of the exhaust path, in a plasma processing apparatus, it is possible to suppress reduction of a plasma processing amount in an outer peripheral portion of a wafer compared to a center of the wafer.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A plasma processing apparatus for processing a substrate using plasma, the apparatus comprising:
    a processing container configured to be depressurizable and to accommodate the substrate in the processing container;
    a stage provided in the processing container and configured to place the substrate on the stage;
    a gas introduction part provided in an upper portion of the processing container to face the stage and configured to introduce a processing gas into the processing container; and
    an exhaust path which is provided in an annular shape in an upper portion of a side wall of the processing container, and in which an opening toward a center of the processing container is formed at an inner circumferential side of the exhaust path,
    wherein the stage and the gas introduction part are respectively connected to high-frequency power supplies for generating plasma of the processing gas in the processing container,
    wherein the exhaust path is grounded,
    wherein the plasma processing apparatus further comprises a plasma distribution adjuster, which is provided so as to cover the opening in the exhaust path and is grounded, and
    wherein a plurality of through-holes is formed in the plasma distribution adjuster.

2. The plasma processing apparatus of claim 1, wherein an opening ratio of a portion, which covers the opening in the exhaust path, in the plasma distribution adjuster is 50% or more and 80% or less.

3. The plasma processing apparatus of claim 2, wherein a shape of each of the through-holes when viewed in a penetration direction of the through-holes is a circular shape having a diameter that is less than a vertical length of the opening in the exhaust path.

4. The plasma processing apparatus of claim 3, wherein all of the through-holes have the same shape, and are formed in the plasma distribution adjuster so as to be uniformly distributed.

5. The plasma processing apparatus of claim 4, wherein a surface of the plasma distribution adjuster has a plasma-resistant coating formed by a ceramic spraying process or an anodizing process.

6. The plasma processing apparatus of claim 5, wherein a lower end portion of the plasma distribution adjuster is formed so as to extend toward the center of the processing container, and is bonded to a bottom wall of the processing container.

7. The plasma processing apparatus of claim 6, wherein the gas introduction part has a convex portion protruding downward from a center portion of a bottom surface of the gas introduction part.

8. The plasma processing apparatus of claim 7, wherein the convex portion of the gas introduction part has a truncated cone shape.

9. The plasma processing apparatus of claim 8, wherein the gas introduction part has an annular groove, which is formed in the bottom surface of the gas introduction part and is concentric with the gas introduction part.

10. The plasma processing apparatus of claim 1, wherein a shape of each of the through-holes when viewed in a penetration direction of the through-holes is a circular shape having a diameter that is less than a vertical length of the opening in the exhaust path.

11. The plasma processing apparatus of claim 1, wherein a shape of each of the through holes when viewed in a penetration direction of the through-holes is an elliptical shape having a vertical length that is longer than that of the opening in the exhaust path.

12. The plasma processing apparatus of claim 1, wherein all of the through-holes have the same shape, and are formed in the plasma distribution adjuster so as to be uniformly distributed.

13. The plasma processing apparatus of claim 1, wherein a surface of the plasma distribution adjuster has a plasma-resistant coating formed by a ceramic spraying process or an anodizing process.

14. The plasma processing apparatus of claim 1, wherein a lower end portion of the plasma distribution adjuster is formed so as to extend toward the center of the processing container, and is bonded to a bottom wall of the processing container.

15. The plasma processing apparatus of claim 1, wherein the gas introduction part has a convex portion protruding downward from a center portion of a bottom surface of the gas introduction part.

16. The plasma processing apparatus of claim 15, wherein the convex portion of the gas introduction part has a truncated cone shape.

17. The plasma processing apparatus of claim 1, wherein the gas introduction part has an annular groove, which is formed in a bottom surface of the gas introduction part and is concentric with the gas introduction part.

* * * * *